United States Patent [19]

Sacher et al.

[11] 4,176,780
[45] Dec. 4, 1979

[54] METHOD AND APPARATUS FOR TESTING PRINTED CIRCUIT BOARDS

[75] Inventors: Eric Sacher, Phoenix, Ariz.; Thomas E. Trebelhorn, San Diego, Calif.

[73] Assignee: NCR Corporation, Dayton, Ohio

[21] Appl. No.: 857,950

[22] Filed: Dec. 6, 1977

[51] Int. Cl.² .................. G06F 11/04; G01R 15/12
[52] U.S. Cl. ..................... 235/302; 235/302.1; 324/73 R
[58] Field of Search ............ 235/302, 302.1, 304.1; 324/73 R, 73 AT

[56] References Cited

U.S. PATENT DOCUMENTS

| | | | |
|---|---|---|---|
| 3,621,387 | 11/1971 | Smith et al. | 324/73 R |
| 3,924,109 | 12/1975 | Jhu et al. | 235/302 |
| 3,924,181 | 12/1975 | Alderson | 235/302 X |
| 3,961,250 | 6/1976 | Snethen | 235/302.1 X |

*Primary Examiner*—Jerry Smith
*Attorney, Agent, or Firm*—J. T. Cavender; Stephen F. Jewett; Edward Dugas

[57] ABSTRACT

A program is developed for testing printed circuit boards by applying a proposed test program to a board which is initially in an arbitrary response state, comparing the resulting response pattern with a reference, modifying the proposed program if necessary to obtain a valid comparison, running the program on the board successively while faults are applied to selective board input nodes, determining penetration of the faults through the board by analyzing the toggle signatures of the response nodes, and again modifying the program if necessary. Circuit boards are tested with the resulting program by accumulating a running toggle signature number for selected response nodes as the program is applied to the test board, periodically sampling the numbers, and comparing the test samples with corresponding samples from a reference board. Defective board devices can then be traced and remedied; if a sampled defect persists, the test program is advanced in single step increments from the preceding sample until the defect is again detected. The board connections to the defective node may then be analyzed to pinpoint the defect.

The invention also includes apparatus for performing the above method with a programmed data processing means and data storage devices.

30 Claims, 9 Drawing Figures

TEST PROGRAM STEP

|   | 1 | 2 | 3 | 4 | • | • | • | n |
|---|---|---|---|---|---|---|---|---|
| 1 | 0 | 0 | 1 | 1 | • | • | • | 0 |
| 2 | 0 | 1 | 0 | 1 | • | • | • | 1 |
| 3 | 1 | 1 | 0 | 1 | • | • | • | 0 |
| • | • | • | • | • | • | • | • | • |
| • | • | • | • | • | • | • | • | • |
| • | • | • | • | • | • | • | • | • |
| m | 1 | 0 | 0 | 0 | • | • | • | 1 |

RESPONSE NODES — RESPONSE PATTERN

SIGNATURE

FAULTED INPUT NODE

|   | 1 | 2 | 3 | • | • | • | P |
|---|---|---|---|---|---|---|---|
| 1 | 0 | ✓ | • | • | • | • | • |
| 2 | ✓ | • | • | • | • | • | • |
| 3 | 0 | 0 | 0 | • | • | • | 0 |
| • | • | • | • | • | • | • | • |
| • | • | • | • | • | • | • | • |
| • | • | • | • | • | • | • | • |
| m | 0 | 0 | ✓ | • | • | • | • |

RESPONSE NODE

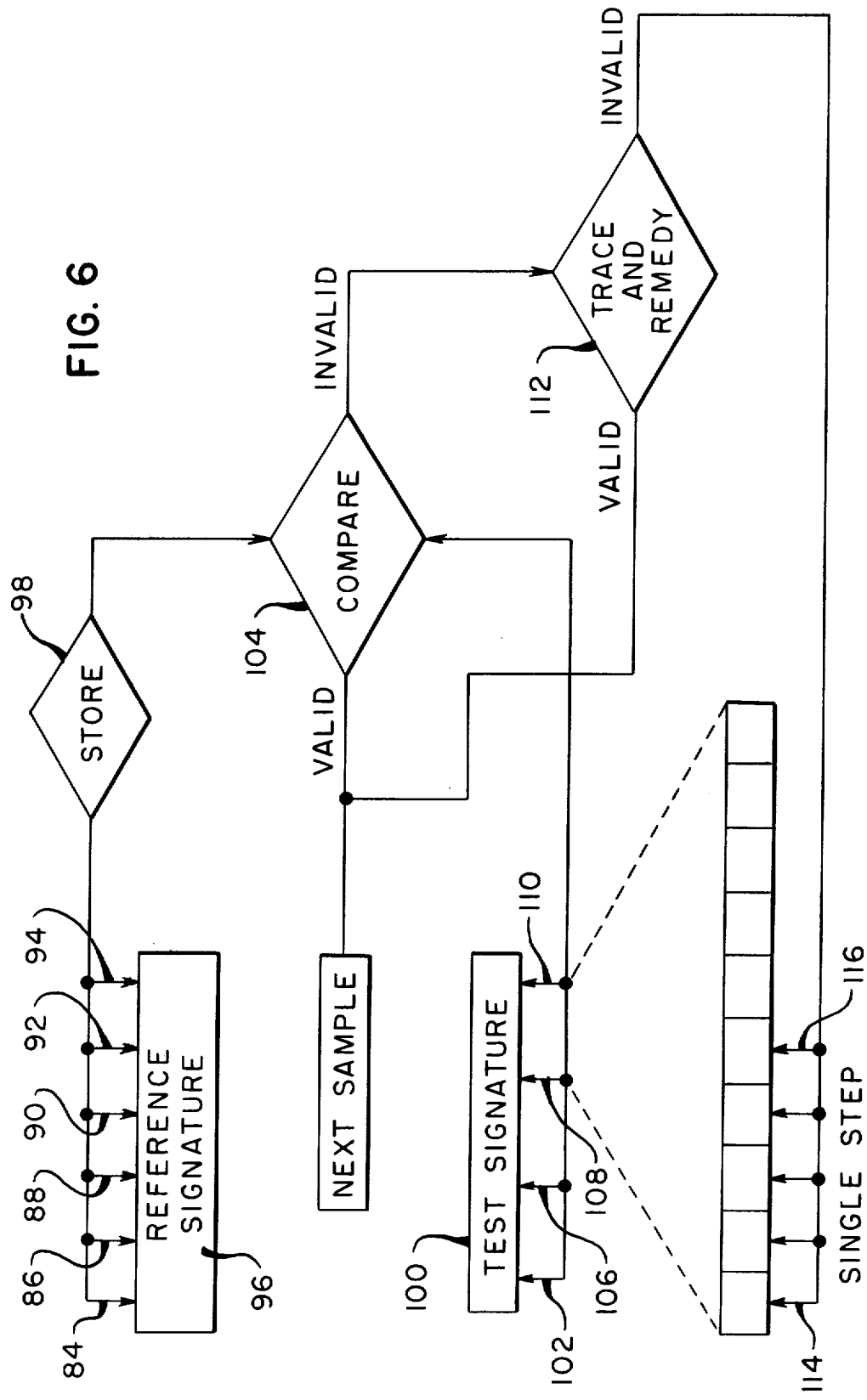

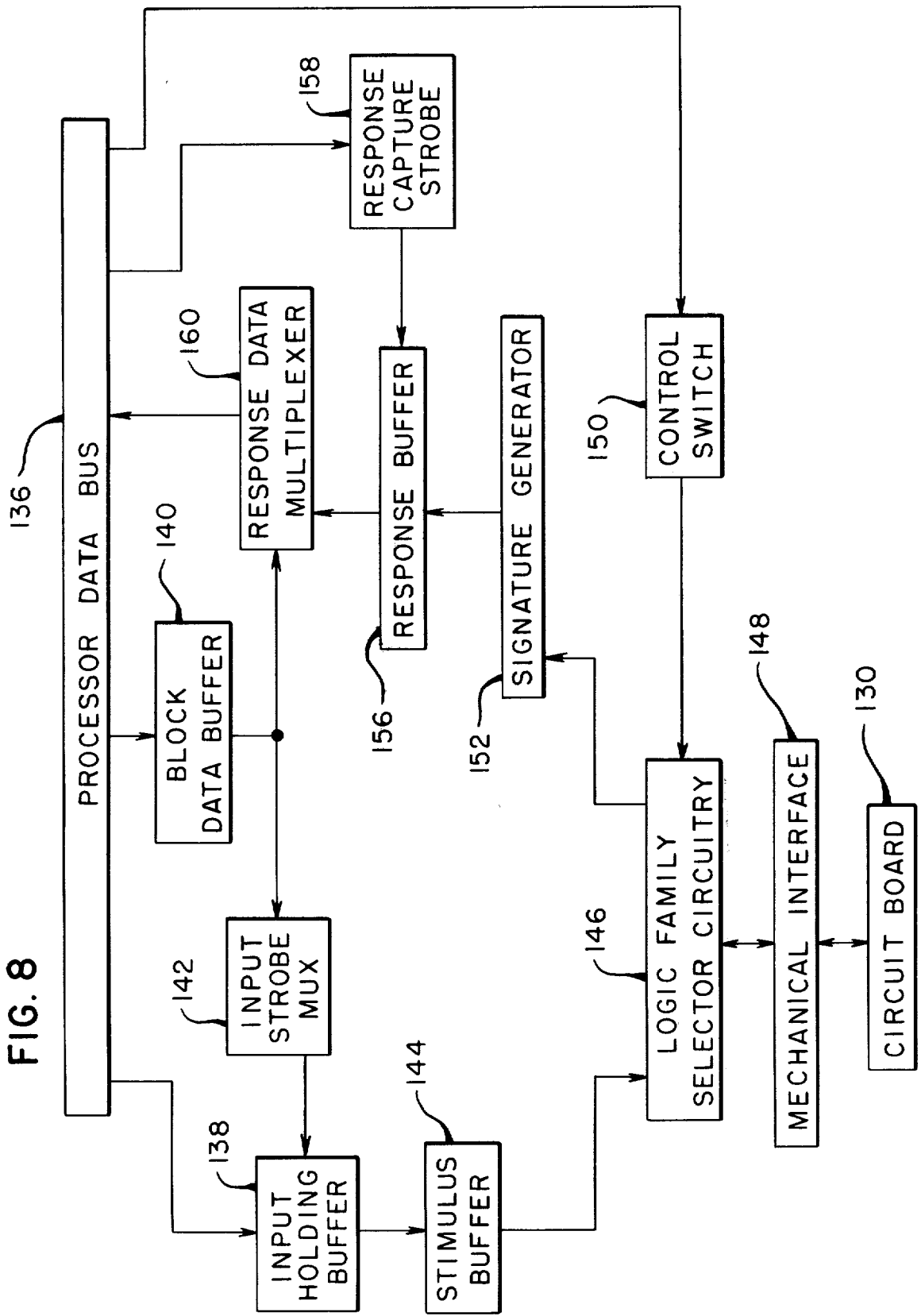

METHOD AND APPARATUS FOR TESTING PRINTED CIRCUIT BOARDS

BACKGROUND

1. Field of the Invention

This invention relates to electrical testing methods, and more particularly to a method and apparatus for testing both the electrical devices and circuit connections of a printed circuit board.

2. Description of the Prior Art

Printed circuit boards are coming into evermore popular use for packaging complex electronic circuits. Such boards today may have many hundreds of electrical devices, including integrated circuit packages or chips which themselves take the place of numerous discrete devices, and thousands of circuit interconnections. Formulating testing procedures to ensure that each of the devices and circuit connections work properly, both by themselves and together on the board, has accordingly become quite important. The ideal testing technique should be able to test all of the board components under the operating conditions they may be expected to encounter, should identify and isolate any defects in either the electrical devices mounted on the board or the connections between such devices, should be efficient in terms of both preparation and operating time, and should be capable of readily accomodating to changes in board design.

Perhaps the most accurate method in use today for testing printed circuit boards involves digital logic simulation. In this technique the logic components or devices, as well as the board topology or network structure, are modeled by a computer program. A programmed set of logic stimuli is then applied to the board model to generate a response which can be used as a reference in testing actual boards. The test program is designed for the specific board to be tested in accordance with known techniques, such as NTS MAINCO programming language.

Digital logic simulation is a very precise technique in that it provides expected response values for all logic nodes on the board, both output nodes at the edge of the board and internal nodes. Defects on a test board can be detected and located with high accuracy, since the expected logic state of each response node can be known for each step of the test program, and compared with the actual output states exhibited by a test board when a test program is run on it. On the other hand, this technique requires the expenditure of a considerable amount of time to both prepare the model and in the actual testing of the boards, and the model must be very accurate in order to achieve good results. Also, while the simulation may be valid, the test program itself may be inadequate to locate some possible defects. The time factor is particularly important when a final board design has not been reached. If the board is subsequently changed the model must also be changed, and this is again a time consuming process. The simulation technique is therefor best adapted to situations in which the final system design has been reached.

Other testing techniques are known which are faster than logic simulation, but which do not produce as much useful information. For example, a test program may be applied to a test board, and the resulting logic pattern at the board output nodes compared with the corresponding pattern for a reference board. With this technique defects on a board may be detected, but they can be quite difficult to isolate. Also, a board defect may exist but not become manifest if it has only a transitory effect during the application of a test program, or if it is cancelled by other defects on the board. In either case, the final test response after the program has run may correspond to the reference response, thereby producing a false indication that the board is operating properly.

Another technique involves the acquisition of transition counts for all or selected output nodes on a test board, and the comparison of these counts with a reference. According to the transition count method, a count is accumulated for selected output nodes as the test program is applied to the board, and a number is added to the count for each output node every time the node shifts from one logic state to the other, or every time a node is sampled. The number added may be either a constant or a known variable, depending upon whether the basic method or a variation thereof is selected.

Several variations of this technique have been developed to reduce the chance of multiple board defects cancelling each other and giving a correct final transition count as a result of incorrect board operation. According to one variation, the original transition count is modified by adding some other number to the basic transition count each time the output node logic state changes. For example, the order of the test program step at which the logic transition occurs may be added to the basic transition number. Thus, if a transition from a "0" to a "1" logic state is indicated by the base transition number 1, that transition on the 178th step of the test program will advance the accumulated transition count by a total of 179.

Another variation on the transition count technique, known as cyclic redundancy code, makes use of a mathematical algorithm to detect output errors over a long sequence of serial data by generating numbers which are unique to the sequence of transitions at the output nodes, rather than being determined solely by the accumulated transition counts. This technique is highly accurate in detecting any deviations from the expected sequence of logic transitions, but like its related transition counting techniques it gives little or no information as to the exact problem which might be causing a divergence between the expected and actual logic sequence at a particular output node.

In a further method known to the art, the individual devices mounted on the board are simply tested one at a time by applying a set of input stimuli to each device, and testing to see if it produces the correct output. While this technique is effective in identifying and isolating particular device problems, it requires the time consuming procedure of placing an integrated circuit probe or clip on every one of the board devices and testing the devices individually. This problem may become prohibitive in the case of large circuit boards, such as those used in high-capacity computer systems. Also, while the operation of each device individually may be ascertained, the board as a whole is untested, and faulty operation due to bad connections or short circuits external to the individual devices may go undetected.

For each of the testing techniques described above, it is assumed that an adequate test program is available to exercise the circuit boards in a proper manner such that any defects on the boards will become manifest by comparing the board response to a reference. In some cases, however, the test program may not exercise the board sufficiently, and certain board defects may pass unnoticed. There is therefor a need for ensuring that a test program intended to be used with a particular board design is indeed adequate for that board.

SUMMARY OF THE INVENTION

In view of the above problems associated with the prior art, the principal object of the invention is the provision of a novel and improved method and apparatus for testing printed circuit boards.

Another object is the provision of a printed circuit board testing method and apparatus which is capable of isolating and identifying board defects, which does not require extensive preparation or running time, and which is flexible and may be readily modified to accomodate to changes in the board design.

Another object is the provision of a novel and improved method and apparatus for evaluating a printed circuit board test program, and for modifying the program if it does not adequately exercise the test board for which it is designed.

These and other objects are achieved in accordance with the present invention by the provision of a method and apparatus for first evaluating and improving a test program to be applied to a printed circuit board, and then using the improved program to actually test printed circuit boards in a unique manner.

The improved test program is derived from an initial program constructed in accordance with known techniques, such as NTS MAINCO, and applying the initial program to a printed circuit board to obtain a reference response pattern and reference transition or toggle signatures from selected response nodes on the board. The board is then exercised to place its response nodes in an arbitrary logic pattern, whereupon the initial program is again applied to the board and a test response pattern obtained from the selected response nodes. The reference and test response patterns are compared and, if they do not correspond, the initial program is modified until a valid comparison is obtained.

The development of the final test program continues by faulting selected input nodes on the board, applying the program with the selected nodes faulted, and obtaining test transition or toggle signatures from the selected response nodes. These signatures are compared with the reference signatures to determine whether the input faults have adequately penetrated the board and, if they have not, the program is again modified until penetration is established.

The test program as modified is then used to test printed circuit boards by first obtaining a reference response characteristic, and then obtaining a response characteristic for the board under test and comparing it to the reference. The reference characteristic is obtained by applying the program to a reference board and, for each of a plurality of selected response nodes on the reference board, accumulating and periodically sampling a running toggle signature number as a program is applied. Test boards are then analyzed by applying the test program to their input nodes, obtaining test toggle signature samples in a manner similar to that for the reference signature samples, and comparing the test samples with the corresponding reference samples.

Defects on the test board are isolated and corrected by stopping the test program at the sample at which an invalid comparison is first detected, tracing back through the board devices from the response node which exhibits the invalid signature, comparing the input and output states of the devices in the path of the trace, and remedying any devices which exhibit an invalid input/output comparison. Should the defect persist, it may be assumed that the problem is on the board, rather than internal to one of the devices mounted thereon. In that case the test program is returned to the program step for the sample next preceeding the invalid sample. By advancing the program from that point in successive single program step increments, analyzing the selected devices at each incremental step until an invalid input/output comparison is obtained, and then analyzing the electrical connections between the output node of the invalid device and the remainder of the board, the board defect may be identified.

In a preferred embodiment for the formulation of the test program, an arbitrary board response pattern is achieved by sequentially applying to the board predetermined portions of the test program, of predetermined length. In the second stage of formulating the test program, toggle signatures for each of the selected response nodes are obtained by faulting each input node in succession, applying the test program to the board each time an input node is faulted, and obtaining a toggle signature for each application of the test program. Successive faulting and program application is continued until either fault penetration to the selected response node is established, or all of the selected input nodes have been faulted, whichever occurs first.

The invention further includes the provision of programmed data processing means communicating with a board through an interface means to accomplish the above program evaluation and board testing functions, and a plurality of data storage devices which are employed in storing the various test and reference data for mutual comparison.

These and other objects and features of the invention will be apparent to those skilled in the art from the following detailed description of a preferred embodiment thereof, together with the appended drawings, in which:

DESCRIPTION OF THE DRAWINGS

FIG. 6 is a flow diagram illustrating the sequence of steps in detecting and isolating defects in either the devices on a circuit board, or in the connections between such devices, in accordance with the invention;

FIG. 8 is a block diagram of the data processor, data storage, and interface means shown in FIG. 7.

DETAILED DESCRIPTION OF A PREFERRED EMBODIMENT

Access to the Printed Circuit Board

Figure 1:
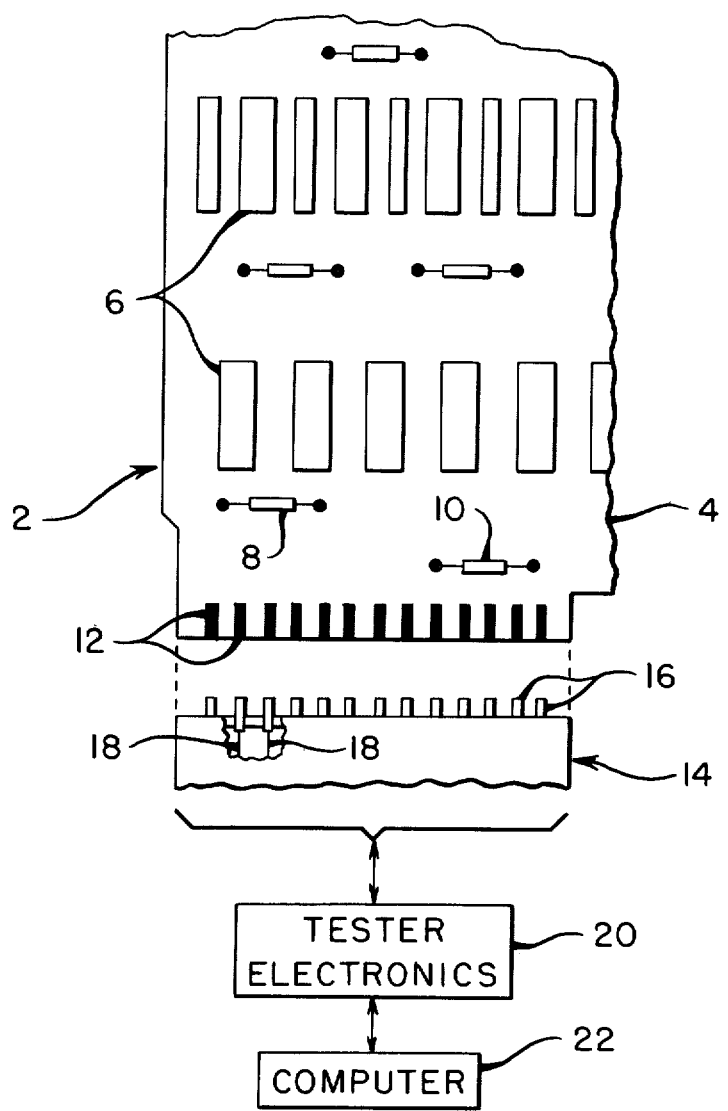
FIG. 1 is a fragmentary plan view of a printed circuit board and connector therefor, indicating their position in the test system.
Figure 2:
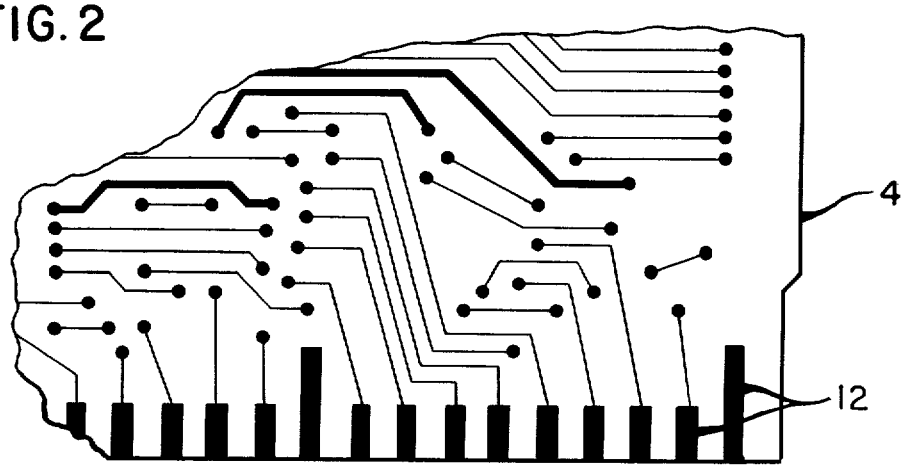
FIG. 2 is a fragmentary plan view of the opposite face of the printed circuit board shown in FIG. 1.

Referring first to FIGS. 1 and 2, a fragmentary portion of a typical printed circuit board 2 is shown. The board comprises a fiberglass substrate 4, on one face of which a plurality of electronic devices, such as dual inline package (DIP) integrated circuit chips 6 and discrete resistors 8 and capacitors 10, are mounted in the usual manner with their respective leads extending through openings provided in the board. A plurality of termination strips 12, each comprising a layer of electrically conductive material deposited on the surface of substrate 4, are distributed along one edge of the board. Electrical connections between the termination strips 12 and the various board devices, and among the board devices themselves, are provided on both sides of board 4 by known means, such as wire wrap or soldering techniques.

A physical interface with the circuit board is provided by means of a connector device 14 having a plurality of clips 16 along one edge, corresponding in number and spacing to terminations 12 on the circuit board. Clips 16 are so disposed that each one establishes a firm electrical contact with a respective one of the termination strips 12 when the connector and board are mutually engaged by pushing their corresponding edges together. Connector 14 provides an electrical interface via leads 18 to tester electronic circuitry 20, which in turn conditions signals to and from a computer 22 which provides the stimulus for testing board 2. The various board devices may be in any one or more of a plurality of different logic families, such as for example emitter-coupled logic, transistor-transistor logic, or diode-transistor logic; a logic interface is accordingly provided by tester electronic circuitry 20 between the board and the computer to ensure compatibility between their logic types. The particular design of the logic interface will depend upon the nature of the specific board to be tested.

Connector 14 is employed to both deliver input signals from the computer to the board, and to deliver output response signals back to the computer for a determination of whether the board is functioning correctly. If the board response at an internal node, as opposed to input and output terminal nodes sensed at termination strips 12, is desired, a separate probe of a type well known in the art is employed and provided with an electrical tie-in to tester electronics 20.

Test Program Development

Figure 3A:
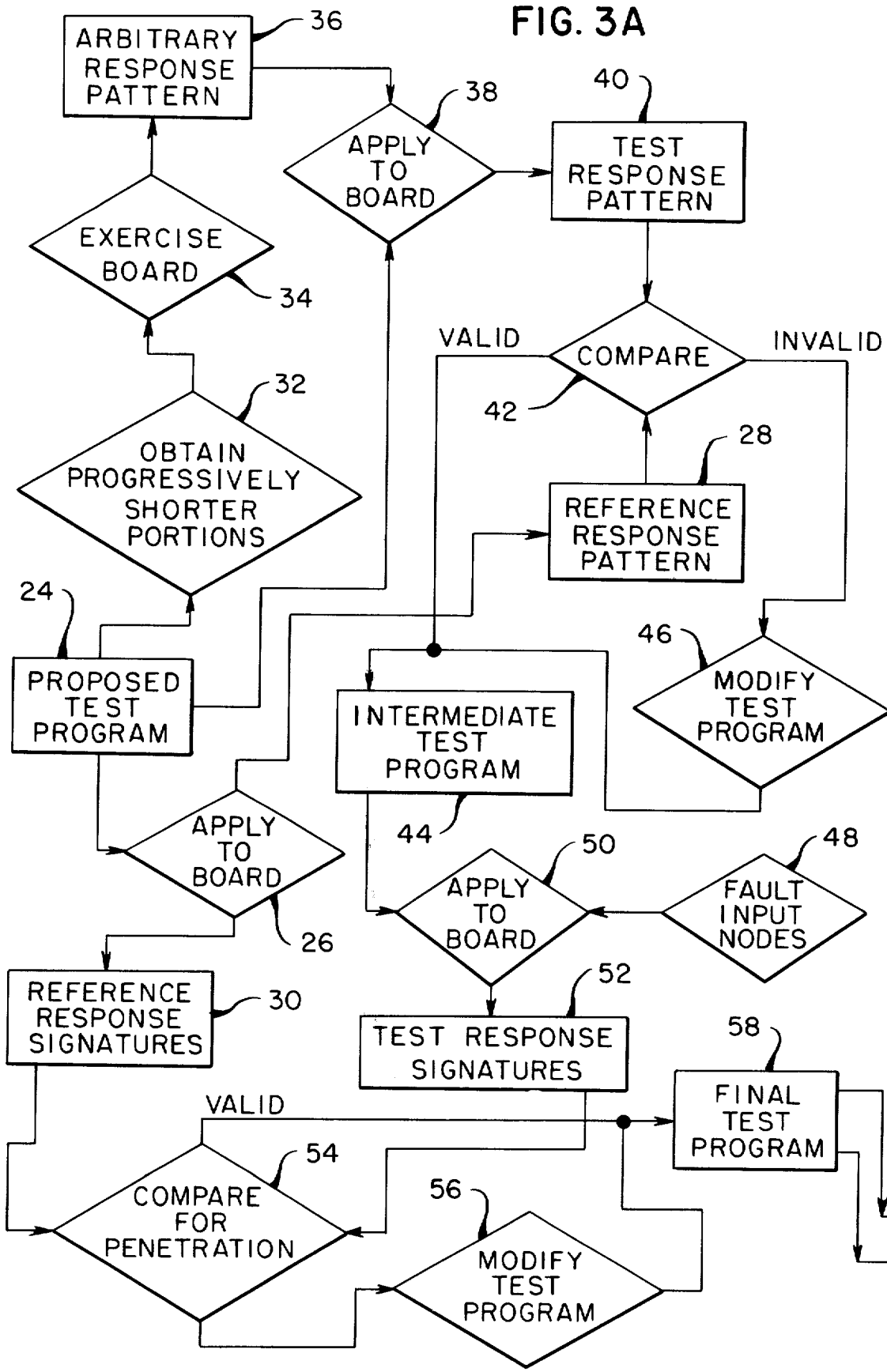
FIGS. 3A and 3B are flow diagrams illustrating the sequence of steps in the method contemplated by the invention to respectively evaluate and improve a test program for printed circuit boards, and to test a circuit board with the final program
Figure 3B:
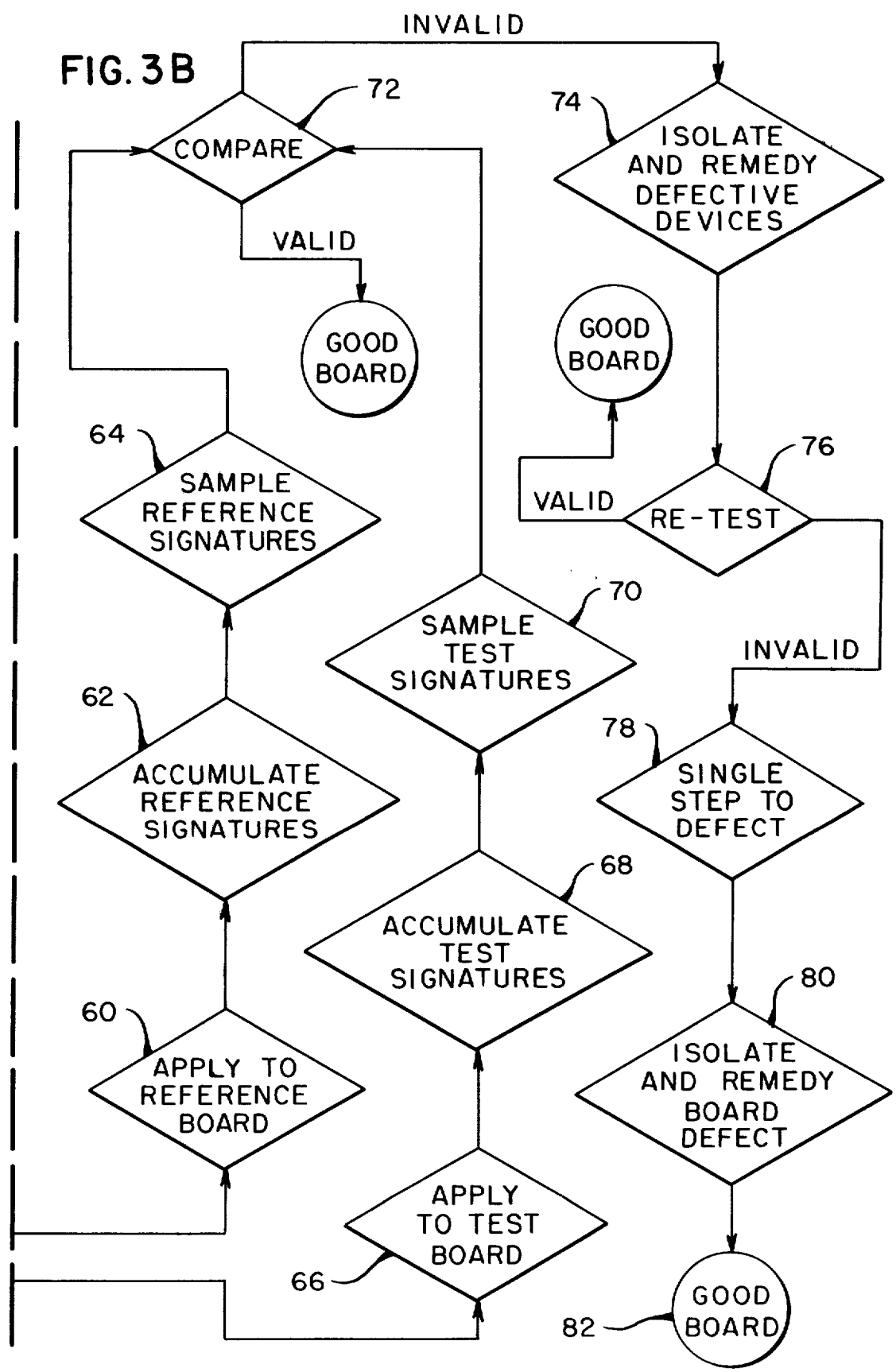

Referring now to FIGS. 3A and 3B, the overall method for testing printed circuit boards as contemplated by the present invention is depicted in flow diagrams. In these figures the operational steps of the method are indicated by diamonds, program states and the results of operating steps are enclosed in rectangles, and the achievement of an acceptable board is indicated by a circle. The method involves two principle subparts: (1) an initial procedure, illustrated in FIG. 3A, in which a proposed test program is evaluated and improved to obtain a final test program suited to the board to be tested; and (2) actual testing of circuit boards, illustrated in FIG. 3B, in which the final test program is used to detect the presence of defects on the board, which defects are then isolated and remedied.

The method illustrated in FIGS. 3A and 3B is applicable generally to any printed circuit board having input nodes, response nodes, and electrical devices such as integrated circuit chips or discrete elements interconnected between the nodes. The term "response node" is intended to include both output nodes which are readily accessible at the edge of a board, and internal nodes which are generally accessed with a special probe or clip well known in the art. At least in the initial stages of the subject method, testing is accomplished most easily and quickly by obtaining response signals only from the output edge nodes, but responses could also be obtained from internal nodes if desired.

Initially, a proposed test program 24 for the particular board to be tested is derived from a prior art technique, such as the NTS MAINCO method referred to above. The program is applied to a reference printed circuit board of the type to be tested in step 26, and a reference response pattern 28 and reference response signatures 30 are obtained from the selected response nodes.

The terms "response pattern" and "response signature" will be explained in conjunction with FIG. 4, which illustrates in tabular form the results, at m selected response nodes, applying an n step test program to a circuit board. Each program step is allocated a vertical column, and each response node a horizontal row. The logic state of each of the response nodes at the conclusion of the various program steps are indicated in the table by the conventional 1–0 notation, respectively representing a high or "on" state, and a low or "off" state. The response patterns shown in the table are arbitrary, being intended for purposes of illustration only, and do not represent any particular circuit board or test program. When the input signal pattern of the first program step is applied to the board input nodes, the input signals are processed through the board until the response nodes assume the logic state indicated in the first column, in which the first and second response nodes are at a logic "0", and the third and m response nodes are at a logic "1". When the second program step is applied, some of the response nodes undergo a change of logic state so that the first node is at a logic "0", the second and third nodes are at a logic "1", and the m node is at a logic "0". This continues until the n or last program step has been applied, at which time the first and third response nodes are at a logic "0", and the second and m nodes are at a logic "1". It can thus be seen that at any given time there is a pattern of logic states for the response nodes, and each of these nodes undergoes a sequence of logic state transitions as the test program is applied to the board. The term "response pattern" refers to the logic pattern of the response nodes as shown in the vertical columns, and particularly to the logic pattern at the completion of the test program under column n. The term "response signature" or "toggle signature" refers to the unique sequence of logic transitions for each response node as the program progresses and is illustrated by the horizontal SIGNATURE row for each input node. Thus, at the end of the program, there is a single response pattern and n response signatures. The response signatures are preferably represented by cyclic redundancy code, referred to above.

A pin skewing technique is preferably employed in applying the program to the input pins or nodes of the circuit board. According to this technique, the set of input signals for each individual step of the test program are applied to the input pins in a staggered sequence, rather than simultaneously. This is done to prevent race conditions on the board and the resulting possibility of indeterminate response states. Pin skewing is a well-known technique, and has been resorted to in the past when a non-functional stimulus pattern such as a test program is applied to a circuit board, since the chance of race conditions occuring under such a stimulus is significant.

Referring back to FIG. 3A and continuing with the method for establishing a test program, when a reference response pattern and response signatures have been obtained, the circuit board is exercised until its response nodes assume an arbitrary logic pattern. This is preferably accomplished by obtaining progressively shorter portions of the program in step 32, and exercising the board with each of these portions in step 34. While many variations of this technique are possible, one example would be to run the first 90% of the test program on the board, then the first 80%, then 70%, and so on. After the last run the selected response nodes of the board will exhibit an arbitrary response 36, and in this state the full proposed test program 24 is again applied to the board in step 38. The resulting response pattern 40 is then compared in step 42 with the previously obtained reference response pattern 28. If the test and reference response pattern are equal, indicating that arbitrary response pattern 36 has not altered the response of the board to the test program, a valid comparison is indicated and the test program may be considered to be in an intermediate stage 44 of the evaluation and improvement procedure. If the compared response patterns are not equal, the comparison is considered to be invalid; the program must then be modified by the programmer in step 46 and the procedure repeated until a valid comparison is eventually obtained. In modifying the program, the programmaer analyzes the faulty nodal signatures obtained from running the test program, and attempts to modify the test program so that (a) all indeterminant nodal logic states are forced to known logic levels, and (b) all potential race conditions are eliminated. The first goal may be accomplished by forcing the logic set or reset functions for each sequential device to its controlling state, i.e., that state which overrides all other inputs and produces a known output state. Race conditions may be eliminated by changing the test logic for only one input at a time, testing the program, and then charging the test logic for another input node if the program is still not working correctly.

After this initial development, the intermediate test program is further tested by determining whether or not its stimuli adequately penetrate through the circuit board. This is accomplished in the preferred embodiment by testing each response node on the board individually to determine whether invalid input signals can penetrate through the board to the response node under observation. A fault is initially applied to and held on the first input node in step 48, and the intermediate test program 44 is applied to the board in step 50 with the fault still on. The term "fault" denotes a situation in which the logic state at a node is different from that which would normally be produced at the node during at least some steps of the test program; a faulted state is conveniently produced by grounding the input node.

A response 52, preferably in the form of a toggle rate signature, is obtained from the first response node when the test program is applied to the board with the first input node faulted. This test response signature is then compared with the previously obtained reference response signature 30 for that response node in step 54, to determine whether or not the fault has penetrated through the board sufficiently to introduce a difference between the test response signature and the reference response signature. If a difference is noted, penetration has been achieved and the remaining response nodes are tested in succession in a similar manner to determine penetration to each of those nodes. If the fault on the first input node has not penetrated to the first response node, the fault is removed and placed on the second input node and the test program again applied to the board. The signature for the first response node is again obtained and compared with the reference signature for that node. If there is still no penetration, each of the input nodes are faulted in succession and the test program applied to the board until either penetration is established, or all of the input nodes have been faulted, whichever occurs first. While under most circumstances the board circuitry will be such that faults on only some but not all of the input nodes will penetrate to a given response node, a total failure of penetration from any of the input nodes to the response node indicates that the test program is inadequate for the board being tested. The program must then be modified in step 56 until penetration is achieved.

Once the presence or absence of penetration to the first response node has been established, penetration to the remaining response nodes is tested in a similar manner. A summary table illustrative of the results which may be obtained from testing each of m response nodes against individual faults on p input nodes is shown in FIG. 5. In this table, penetration (an inequality between the test and reference response signatures for a particular response node) is indicated by a check, and lack of penetration by a 0. In the illustrative table shown, it is seen that with a fault on the first input node the signature obtained at the first response node equals the corresponding reference response signature, and accordingly a 0 is marked in the appropriate box to indicate lack of penetration. With a fault on the second input node, penetration was established to the first response node, as indicated by the check mark. At this point testing would generally be shifted from the first to the second response node. At the second response node, penetration is indicated for a fault on the first input node. Further testing of this response node would accordingly normally be terminated, and the remaining response nodes would then each be tested in succession.

Figures 4, 5, 7:
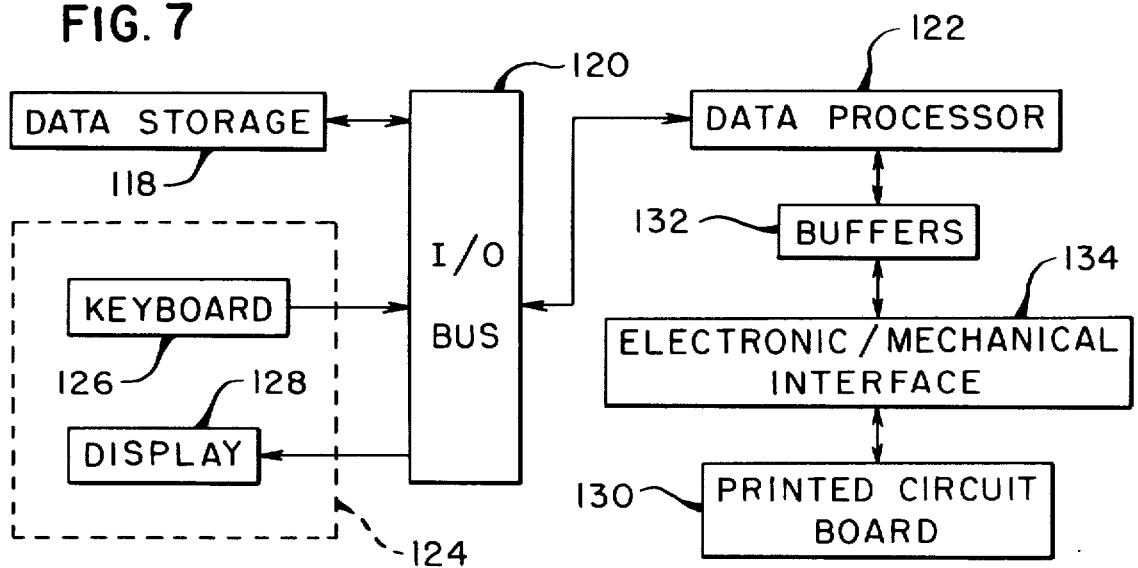
FIG. 4 is a table showing an illustrative circuit board response pattern obtained at one point in the development of a test program in accordance with the invention.
FIG. 5 is a table showing an illustrative circuit board response obtained subsequent to the response pattern of FIG. 4.
FIG. 7 is a block diagram of data processor and associated apparatus suitable for practicing the invention.

Rather than modify the test program at the first occurrence of a penetration failure, a table such as that shown in FIG. 5 would normally be generated and stored as the testing progresses, so that a comprehensive picture of the boards response to the test program is obtained. For example, no penetration is shown for the third response node, but compilation of the table is completed before remedial action is taken. At this time the test program is modified if necessary, step 56, in light of the entire table. This last modification produces the final test program 58, which can then be used to test circuit boards on a large scale basis.

Circuit Board Testing

The overall approach in applying the final test program to testing of printed circuit boards involves applying the program to a reference board having known good operating characteristics to obtain a reference response, applying the program to the board being tested to obtain a test response, comparing the reference and test responses to determine the presence or absence of any defects on the board, and finally isolating particular defects which may be detected so that they can be remedied. The reference board is preferably one which has already been used in an operating or a prototype system and has been found to operate properly.

Referring to FIG. 3B, a reference response is obtained by applying the final test program 58 from FIG. 3A to the reference or known good board, step 60, and accumulating reference toggle signature numbers for each of the response nodes as the program progresses, step 62. The signature number for each response node is periodically sampled at a predetermined sample rate, step 64; the resulting sample information is stored as a reference response characteristic for later comparison with the corresponding characteristic of the board being tested. The aforementioned periodic sampling in effect divides the response characteristic into successive blocks, each of which can be analyzed if necessary to isolate a defect on the board. In determining the sampling rate, a trade-off is made between a relatively rapid sampling rate on the one hand, which produces a high level of information and enhances the ease of isolating a defect, but requires more time to perform the sampling and additional storage capacity to store samples, and a relatively infrequent sampling rate on the other hand, which requires less operating time and storage capability but also produces less information and makes the isolation of a detected defect more time consuming. A representative sampling rate would be one sample for every ten program steps.

Similar information is obtained for the test board by first applying the final test program 58 to the test board, step 66, accumulating a toggle signature number for each selected response node of the test board, step 68, and sampling the accumulated test signature numbers at the same sampling rate as for the reference samples, step 70. After each sample the test and reference signature numbers may be either reset or permitted to continue accumulating, so long as they are both treated in the same manner.

The reference and test signature samples for each response node are then compared, step 72. An equality between the compared samples equates to a valid result, indicating that the test board is good. If any inequalities between the compared samples are detected, a defect somewhere on the board is indicated, and the test program is stopped at the first sample at which the inequality appears. At this point an attempt is made to isolate and remedy any circuit board device which may be defective and causing the invalid comparison, step 74, by tracing back into the board from the response node at which the invalid comparison was noted. Each of the circuit devices encountered in tracing back from the response node toward the input nodes is tested by comparing its input and output states to determine if they are compatible, and remedial action such as replacement or repair is rendered to any device which does not exhibit a valid input/output comparison. The corrected board is then retested, step 76, by again applying the test program to obtain new test signature samples, and comparing them against the reference samples. If there is now a valid comparison it can be assumed that the defect was internal to the remedied device, and was removed by the remedial action.

If the malfunction persists despite such remedial action, or if no defective board devices are found, the problem is most likely in one of the board connections rather than internal to one of the devices. A single step routine 78 is then entered to isolate and remedy the board defect. Pursuant to this routine the test program is again applied to the board, and stopped at the last test sample preceeding the sample at which the invalid comparison first appears. The test program is then advanced in single program step increments, one at a time. At each incremental step an analysis is performed on the input and output nodes of these board devices which could have contributed to the invalid signature. Where a defective board device has previously been located and remedied, only that device is analyzed. Where no defective board devices have previously been located, the input and output states of all of the board devices in the logic path for the pertinent board output node are selected for analysis at each step. Incrementing of the program is terminated at the first step for which the input and output of a board device do not correspond. Appropriate means, such as the Model 2220 "Bug Hound" test instrument produced by Gen Rad of Concord, Massachusetts, are then employed to trace the current flows to and from the device output node to locate the problem on the board which is causing the invalid input/output situation. The board defect is thus isolated, and appropriate remedial action taken, step 80, to complete the testing process and produce a final good board 82.

Referring now to FIG. 6, a somewhat more detailed flow diagram of the method of detecting and isolating a defect is shown. This figure depicts a sequence in which six samples 84, 86, 88, 90, 92, and 94 have been taken at spaced intervals from an accumulating reference toggle signature number 96, and stored for later comparison with a corresponding test board signature, step 98. The test program is then applied to the test board and a toggle signature number 100 accumulated for the selected response nodes. A first sample 102 is taken at the same program step as the first sample 84 from the reference signature, and compared in step 104 with reference sample 84. If the samples are equal, the comparison is valid, and the program continues running on the test board until a second sample 106 is taken and compared to the second reference sample 86. If this comparison is also valid, additional samples will be taken from the test signature and compared with their corresponding reference signature samples.

Now assume that the comparison for the third sample 108 is valid, but is invalid for the fourth test sample 110. A board device having incompatible input and output logic states is then traced and remedied, step 112, as described above. If this removes the defect and results in a valid comparison between the test and reference samples, application of the program to the test board is continued by restarting the test and subsequent samples are taken and compared against the reference. If the remedial action does not remove the defect and the sample comparison is still invalid, the program is restarted on the test board, stopped at sample 108, and then advanced one more program step to step 114. At this time the opposite ends of each circuit connection to the remedied device's output node are analyzed in an attempt to locate a board defect, such as a short or open circuit. If no defect is manifest, the program is advanced in single step increments, stopping to analyze the current flows at each step in an attempt to locate the defect.

Assuming that a defect is found at the fifth step 116, appropriate remedial action is taken to repair the defect and the test is restarted to locate any other defects that may exist. A similar procedure would be followed if no defective board devices had been located, but in this case all of the devices which could have contributed to the invalid signature are analyzed at each incremental step.

While the method described above involves stopping the test program each time a defect is located for certain board circuit designs, it would also be possible to run the entire program on a test board and merely log the occurrence of detected defects, then return to locate and remedy individual defects after the full test is completed.

In addition to isolating particular device and board defects, the block signature described above may also be used to identify any indeterminate states which may exist in the logic, such as in uninitiated memories. Certain blocks of information can therefore be isolated and labeled indeterminate, and the test continued, while still maintaining a valid test.

Apparatus

FIG. 7 shows in block diagram form the major components of a circuit board test system constructed in accordance with the present invention. A data storage device 118, preferably in the form of a magnetic medium such as a flexible disk, contains the NTS MAINCO test program and may also be used to hold reference data generated with a reference board. It is connected through an input/output bus 120 to a data processor 122 which is programmed to perform the comparison between the reference and test data, and log board response information onto data storage medium 118. Other peripheral devices connected to the system through input/output bus 120 include a display unit 124 comprising a keyboard 126 which enables data and instructions to be introduced into the system. Such instructions include those used in directing a probe to trace back into the board to locate defects, or to single step a stored test program. A display means 128 such as an oscilloscope is provided for displaying the results of the device testing.

Data processor 122 communicates with a printed circuit board 130 through a series of buffers 132 which are used to temporarily store and accumulate both input and output data, and an electronic/mechanical interface 134 which provides both logic family compatibility between the processor and board, and the physical connections by which the board is tested.

A more detailed diagram of the portion of the system from the data processor to the circuit board is provided in FIG. 8. A data bus 136 of data processor 122 is connected to an input holding buffer 138 which accumulates input information from the data bus until a block of information suitable for application to a printed circuit board has been accumulated. Buffer 138 is necessary because data processor 122 typically provides data in groups of 16 bits, whereas logic boards are typically adopted to accept data in groups of 300–400 bits at one time or in rapid succession. The routing of information bits from the data processor to the various blocks of input holding buffer 138 is controlled by a block data buffer 140, while an input strobe multiplexer 142 interfaces between block data buffer 140 and input holding buffer 138 to control the loading of information from input holding buffer 138 into a stimulus buffer 144. The latter element actually causes test logic to be applied to the board under test. Connected to the output of stimulus buffer 144 is circuitry 146 for converting the stimulus signals to the unique logic family or combination of families of the particular board to be tested. This function could be implemented by mechanical switching devices, such as relays on a crossbar switch matrix, or by an electrical design capable of creating and sensing the unique voltages required by the particular board being tested. The resulting logic compatible signals are applied to the board through a mechanical interface 148 comprising either connector 14 of FIG. 3 or, when a defect is being isolated after having been detected, a mechanical probe having access to internal nodes on the circuit boards as well as the edge output nodes. In the latter case a logic clip is preferably connected over the integrated circuit device from which a signal is to be obtained, and a mechanical probe such as that used with an oscilloscope is employed to contact the clip. Selection of a particular logic family is governed by a control switch 150, which interfaces between data bus 136 and logic selector circuitry 146.

Output and/or internal node signals are transmitted from a circuit board 130, through mechanical interface 148, and back through logic family selector circuitry 146 to a signature generator circuit 152 which generates the particular kind of signature called for. It will be recalled, for example, that in the preferred embodiment cyclic redundancy code is employed. Accordingly, signal generator 152 is designed to generate such a code based upon the board response signals provided to it by logic family selector circuitry 146. The signal generator could be implemented by a conventional CRC generator design generally referred to in the industry as generic part no. MC8506P, or by a binary counter-generic part no. 9316. The generated signatures are sampled under the control of data bus 136 at a predetermined sampling rate and the resulting samples captured in a response buffer 156, the contents of which are periodically routed back to the processor data bus under the influence of a response-capture strobe 158, through a response data multiplexer 160. Multiplexer 160, preferably implemented as generic part no. 74S152, reduces the response information back to 16 bit groups suitable for the data bus, from whence the information samples are logged onto magnetic media data storage means and compared with the stored reference data.

The described apparatus may be used both in the development of a test program, in which case the various stimuli patterns for exercising a circuit board would be applied to the data processor from data storage device 118, and in testing boards of unknown validity and comparing the test results to a previously established reference in accordance with the invention.

While the above method will produce a satisfactory circuit board test for the great majority of cases, in certain situations the test program may not be able to detect particular board defects, even after modification pursuant to the teachings of the invention. This may result from either the particular board design, the initial test program, or a combination of the two. Should it occur, it may be feasible to supplement the test program with additional stimuli directed specifically at the otherwise undetected defect, or on the other hand it may be desirable to forego further program modification and resort instead to simulation testing. Generally speaking, simulation becomes relatively more attractive when the circuit board design has been finalized and the above-described method has not produced a foolproof test program, while program modification is preferred when the board design is still not firm.

Although a particular embodiment of the invention has been shown and described, it should be understood that numerous modifications and variations thereof may be made by one skilled in the art and still come within the scope and spirit of the invention, which is limited only in terms of the appended claims.

We claim:

1. A method of testing printed circuit boards having circuit connected electrical devices and input and response nodes, comprising the sequential steps of:
   (A) evaluating and improving a test program for said boards by:
      (1) applying the program to the input nodes of a printed circuit board, and obtaining from selected response nodes on said board a reference response pattern and reference toggle signatures,
      (2) exercising the board to produce an arbitrary response pattern,
      (3) applying the program to the board in said arbitrary response state, and obtaining a test response pattern from said selected response nodes,
      (4) comparing said reference and test response patterns and, if a valid comparison is not obtained, modifying the program to obtain a valid comparison,
      (5) faulting selected input nodes on the board,
      (6) applying the program to the board with said selected nodes faulted, and obtaining test toggle signatures from selected response nodes while the program is applied, and
      (7) comparing said reference and test toggle signatures to determine the penetration of said faults through the circuit board and, if the faults have not penetrated, modifying the program until penetration is established, and
   (B) using said program to test printed circuit boards by:
      (1) obtaining a reference response characteristic, by
         (a) applying said program to the input nodes of a reference board, and
         (b) for each of a plurality of selected response nodes on the reference board
            (i) accumulating a running toggle signature number as the program is applied,
            (ii) periodically sampling said number at a predetermined sampling rate, and
            (iii) storing the samples thus obtained as a reference response characteristic, and
      (2) analyzing a test board, by
         (a) applying the program to the input nodes of the test board,
         (b) for each of a plurality of selected test board response nodes corresponding to the selected response nodes on the reference board,
            (i) accumulating a running toggle signature number as the program is applied, and
            (ii) periodically sampling said number at sampling intervals corresponding to the sampling rate for the reference board, and
            (c) comparing the test samples thus obtained with the corresponding stored reference samples to detect defects manifested by invalid comparisons between a test sample and its corresponding reference sample.

2. The method of claim 1, wherein step (A)(2) comprises exercising the board by sequentially applying thereto predetermined test program portions of varying length.

3. The method of claim 1, wherein steps (A)(5), (6), and (7) include, for each selected response node:
   faulting said input nodes successively in a predetermined order, applying the test program to the board concurrently with each faulted node, obtaining a toggle signature for said response node for each application of the test program, and comparing the toggle signatures thus obtained with the reference toggle signature for said response node to determine penetration of said faults to said response node.

4. The method of claim 1, further comprising the step of isolating defects detected on the test board by stopping the program at the sample at which an invalid comparison is first detected, tracing back into the test circuit board from said response node through the board devices, comparing the states of the input and output nodes of said devices, and rendering remedial action to any such devices which exhibit an invalid input-output comparison.

5. The method of claim 4, further comprising a single stepping test sequence for boards having a defect which survives said remedial action, said sequence comprising:
   returning the program to the program step corresponding to the next preceding test sample having a valid signature comparison, advancing the program therefrom in successive single program step increments, analyzing selected board devices at each incremental step to detect the first occurance of an invalid input-output comparison, and analyzing the electrical connections between the output node of the invalid device and the remainder of the board at said first occurrence, to identify a board defect associated with said invalid comparison.

6. A method for evaluating and improving a test program for printed circuit boards having circuit connected input and response nodes, comprising the steps of:
   (A) applying the program to the input nodes of a printed circuit board, and obtaining from selected response nodes on said board a reference response pattern and reference toggle signatures,
   (B) exercising the board to produce an arbitrary response pattern,
   (C) applying the program to the board in said arbitrary response state, and obtaining a test response pattern from said selected response nodes,
   (D) comparing said reference and test response patterns and, if a valid comparison is not obtained, modifying the program to obtain a valid comparison,
   (E) faulting selected input nodes on the board,
   (F) applying the program to the board with said selected nodes faulted, and obtaining test toggle signatures from selected response nodes while the program is applied, and
   (G) comparing said reference and test toggle signatures to determine the penetration of said faults through the circuit board and, if the faults have not pentrated, modifying the program until penetration is established.

7. The method of claim 6, said circuit board exercising step comprising sequentially applying predetermined portions of the test program to the board.

8. The method of claim 7, said sequential test program portions comprising respective initial portions of the test program.

9. The method of claim 8, said sequential test program portions comprising progressively lesser portions of the test program.

10. The method of claim 6, wherein steps (E), (F), and (G) include, for each selected response node:
  faulting said input nodes successively in a predetermined order, applying the test program to the board concurrently with each faulted node, obtaining a toggle signature for said response node for each application of the test program, and comparing the toggle signatures thus obtained with the reference toggle signature for said response node to determine penetration of said faults to said response node.

11. The method of claim 10 wherein, for each selected response node, said successive faulting and test program applications are continued until either penetration of a fault to the selected response node is established, or all of the selected input nodes have been faulted, whichever occurs first.

12. A method for evaluating a test program for printed circuit boards having circuit connected input and response nodes, comprising the steps of:
  (A) applying the program to the input nodes of a printed circuit board, and obtaining from selected response nodes on said board a reference response pattern,
  (B) exercising the board by sequentially applying thereto predetermined test program portions of varying lengths to produce an arbitrary response pattern,
  (C) applying the program to the board in said arbitrary response state, and obtaining a test response pattern from said selected response nodes, and
  (D) comparing said reference and test response patterns.

13. A method for evaluating a test program for printed circuit boards having circuit connected input and response nodes, comprising the steps of:
  (A) applying the program to the input nodes of a printed circuit board, and obtaining reference responses from selected response nodes,
  (B) for each of said selected response nodes,
    (1) faulting selected input nodes on the board,
    (2) applying the test program to the board concurrently with each faulted node, and
    (3) obtaining a test response for said response node for each application of the test program, and
  (C) comparing said reference and test responses to determine the penetration of said faults through the circuit board.

14. A method of testing printed circuit boards having circuit connected input and response nodes with a multistep program, comprising the steps of:
  (A) obtaining a reference response characteristic, by
    (1) applying the program to the input nodes of a reference board, and
    (2) for each of a plurality of selected response nodes on the reference board,
      (a) accumulating a running toggle signature number as the program is applied,
      (b) periodically sampling said number at a predetermined sampling rate, and
      (c) storing the samples thus obtained as a reference response characteristic, and
  (B) analyzing a test board, by
    (1) applying the program to the input nodes of the test board,
    (2) for each of a plurality of selected test board response nodes corresponding to the selected response nodes on the reference board,
      (a) accumulating a running toggle signature number as the program is applied, and
      (b) periodically sampling said number at sampling intervals corresponding to the sampling rate for the reference board, and
    (3) comparing the test samples thus obtained with the corresponding stored reference samples to detect defects manifested by invalid comparisons between a test sample and its corresponding reference sample.

15. The method of claim 14, wherein the initial manifestation of a test board defect is isolated between the first test sample having an invalid comparison with its corresponding reference sample, and the next preceding test sample having a valid comparison with its corresponding reference sample.

16. The method of claim 15, further comprising the step of identifying the test program step at which a board defect first becomes manifest, by returning the program to the program step corresponding to said next proceding test sample which has a valid comparison, advancing the program therefrom in successive single program step increments, and analyzing the board at each incremental step to identify the detect.

17. The method of claim 14, wherein a cyclic redundancy code is used to accumulate said running toggle rate signature numbers.

18. The method of claim 14, wherein said running toggle signature numbers are reset after sampling.

19. The method of claim 14, wherein said running toggle signature numbers are continuously accumulated over the period the test program is applied.

20. A method of testing printed circuit boards having circuit connected electrical devices, and input and response nodes, and of remedying boards found to be defective, comprising the steps of:
  (A) obtaining a reference characteristic by
    (1) applying a multistep test program to the input nodes of a reference board, and
    (2) for each of a plurality of selected response nodes on the reference board,
      (a) accumulating a running toggle signature number as the program is applied,
      (b) periodically sampling said number at a predetermined sampling rate, and
      (c) storing the samples thus obtained as a reference response characteristic,
  (B) analyzing a test board, by
    (1) applying the program to the input nodes of the test board,
    (2) for each of a plurality of selected test board response nodes corresponding to the selected response nodes on the reference board,
      (a) accumulating a running toggle signature number as the program is applied, and
      (b) periodically sampling said number at sampling intervals corresponding to the sampling rate for the reference board, and (3) comparing the test samples thus obtained with the corresponding stored reference samples to detect defects manifested by invalid comparisons between a test sample and its corresponding reference sample, and (C) isolating such defects by stopping the program at the sample at which an invalid comparison is first detected, tracing back into the circuit board from said response node through the board devices, comparing the states of the input and output nodes of said board devices, and rendering remedial action to any such board devices which exhibit an invalid input-output comparison.

21. The method of claim 20, further comprising a single stepping test sequence for boards having a defect which survives said remedial action, said sequence comprising:

returning the program to the program step corresponding to the next preceding test sample having a valid signature comparison, advancing the program therefrom in successive single program step increments, analyzing selected board device at each incremental step to detect the first occurance of an invalid input-output comparison, and analyzing the electrical connections between the output node of the invalid device and the remainder of the board at said first occurrence, to identify a board defect associated with said invalid comparison.

22. The method of claim 21, wherein the electrical connections between the output node of the invalid device and the remainder of the board are analyzed by measuring the current flows supported by said connections.

23. The method of claim 20, said selected response nodes comprising output nodes adjacent the edge of the board.

24. Apparatus for evaluating a test program for a printed circuit board having circuit connected input and response nodes, comprising:

(A) a plurality of data storage devices, (B) means electrically interfacing the input and response nodes of said board with a programmed data processing means, and (C) programmed data processing means communicating with said board through said interface means, for sequentially:

(1) applying the test program to the board input nodes, (2) receiving and storing in said data storage devices a reference response pattern from selected response nodes on the board, (3) applying input stimuli to exercise the board to produce an arbitrary response pattern thereon, (4) applying the test program to the board in said arbitrary response state, (5) receiving and storing in said data storage devices a test response pattern from said selected response nodes, and (6) comparing said stored reference and test response patterns for mutual compatibility.

25. The apparatus of claim 24, said data processing means being programmed to exercise the circuit board by applying successive test program portions of varying duration to the board input nodes.

26. Apparatus for evaluating a test program for a printed circuit board having circuit connected input and response nodes, comprising:

(A) a plurality of data storage devices, (B) means electrically interfacing the input and response nodes of said board with a programed data processing means, and (C) programmed data processing means communicating with said board through said interface means, for:

(1) applying the test program to board input nodes, (2) receiving and storing in said data storage devices reference toggle signatures from selected response nodes on the board, (3) applying fault signals to selected input nodes on the board, (4) applying the test program to the board input nodes with said selected input nodes faulted, (5) receiving and storing in said data storage devices test toggle signatures from said selected response nodes while the program is applied, (6) comparing said reference and test toggle signatures to determine fault penetration from said selected input nodes to said selected response nodes.

27. The apparatus of claim 26, said data processing means being programmed, for each of said selected response nodes, to apply fault signals sequentially to said selected input nodes, to apply the test program to said input codes concurrently with each faulted node, and to receive and store in said data storage devices the toggle signature of said response node for each application of the test program.

28. Apparatus for obtaining a reference response characteristic for use in testing printed circuit boards having circuit connected input and response nodes, comprising:

(A) a plurality of data storage devices, (B) means for electrically interfacing the input and response nodes of a reference board with a data processing means, and (C) programmed data processing means adapted to communicate with a reference board through said interfacing means, for sequentially:

(1) applying a test program to the input nodes of the reference board, and (2) for each of a plurality of selected response nodes on the reference board, (a) accumulating a running toggle signature number as the test program is applied, (b) periodically sampling said number at a predetermined sampling rate, and (c) storing said samples in said data storage devices as a reference response characteristic.

29. A method for evaluating and improving a test program for printed circuit boards having circuit connected input and response nodes, comprising:

applying the program to the board first and second times with the board response nodes in first and second initial logic states, respectively, and obtaining respective first and second response patterns therefrom, comparing said first and second response patterns and, if a valid comparison is not obtained, modifying the program to obtain a valid comparison, applying the program to the board with selected ones of said input nodes faulted, and determining the penetration of said faults through the board to said response nodes, and modifying the test program if necessary to achieve fault penetration.

30. A method for evaluating and improving a program for testing printed circuit boards having circuit connected electrical devices and input and response nodes, comprising the sequential steps of:

(A) generating a test program, (B) applying the test program to the input nodes of a printed circuit board, and storing the responses to said program of selected response nodes on said board, (C) placing the logic states of said selected response nodes in an arbitrary pattern, (D) applying the program to the board in said arbitrary response pattern, and obtaining test responses to said program of of said selected response nodes, and (E) comparing said stored and test responses and, if a valid comparison is not obtained, modifying the program to obtain a valid comparison.

* * * * *